United States Patent [19]

DeHond et al.

[11] Patent Number: 4,627,152

[45] Date of Patent: Dec. 9, 1986

[54] AUTOMATIC LAYOUT FOR CASCODE VOLTAGE SWITCH LOGIC

[75] Inventors: Mitchell R. DeHond, Essex Junction; Paul J. Ledak, Colchester, both of Vt.

[73] Assignee: International Business Machines Corporation, Armonk, N.Y.

[21] Appl. No.: 737,614

[22] Filed: May 24, 1985

[51] Int. Cl.[4] .................... H01L 29/78; H01L 21/78
[52] U.S. Cl. .................................. 29/571; 29/569 R; 29/577 C
[58] Field of Search ............... 29/571, 577 C, 569 R; 357/42, 45; 307/451

[56] References Cited

U.S. PATENT DOCUMENTS

| | | | |
|---|---|---|---|
| 4,356,504 | 10/1982 | Toyun | 357/42 |
| 4,412,237 | 10/1983 | Matsumura | 357/42 |
| 4,513,307 | 4/1985 | Brown | 357/45 |

Primary Examiner—Brian E. Hearn
Assistant Examiner—John T. Callahan
Attorney, Agent, or Firm—Sughrue, Mion, Zinn, Macpeak, and Seas

[57] ABSTRACT

A method for automatically laying out a circuit starting from a logic gate diagram, especially for a CMOS technology. The logic is divided into blocks having a maximum number of serially connected transistors. Then the transistors are ordered to maximize the number of contiguously connected transistors. The ordered transistors then have their remaining connections determined according to the type of logic gate they represent.

4 Claims, 13 Drawing Figures

FIG. 5
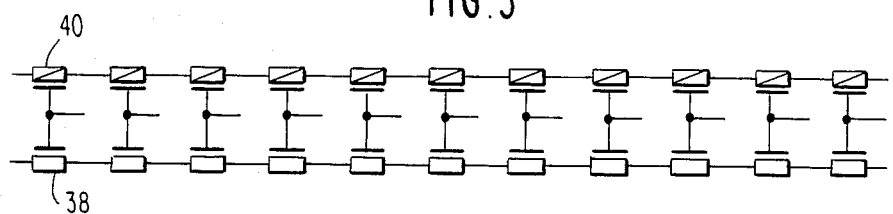
FIG. 6
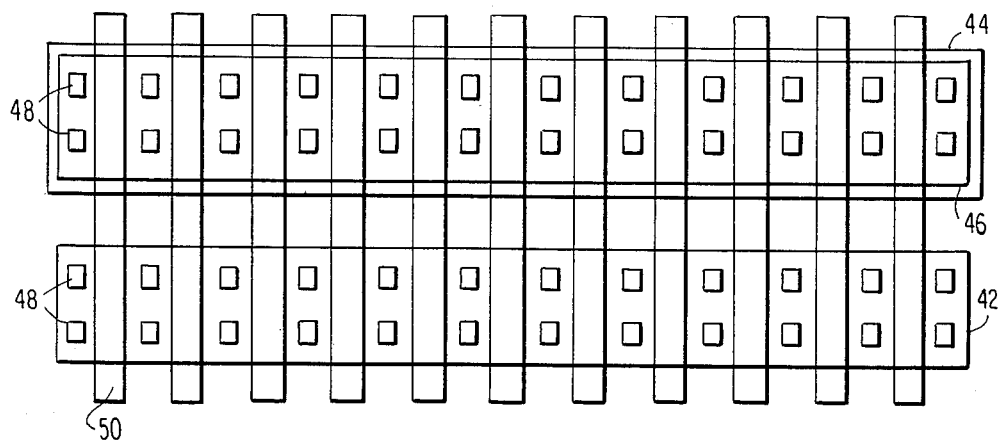
| GATE TYPE | | OUTPUT VALUE |
|---|---|---|
| AND (NAND) | P | MAX (INPUT VALUES) |
| | N | Σ (INPUT VALUES) |
| OR (NOR) | P | Σ (INPUT VALUES) |
| | N | MAX (INPUT VALUES) |
FIG. 7
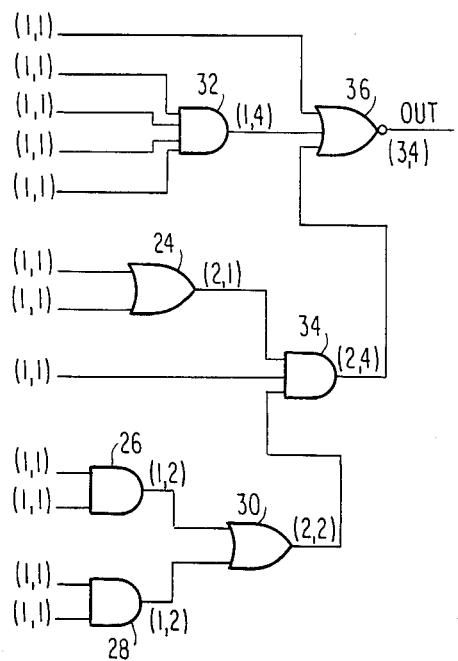
FIG. 8

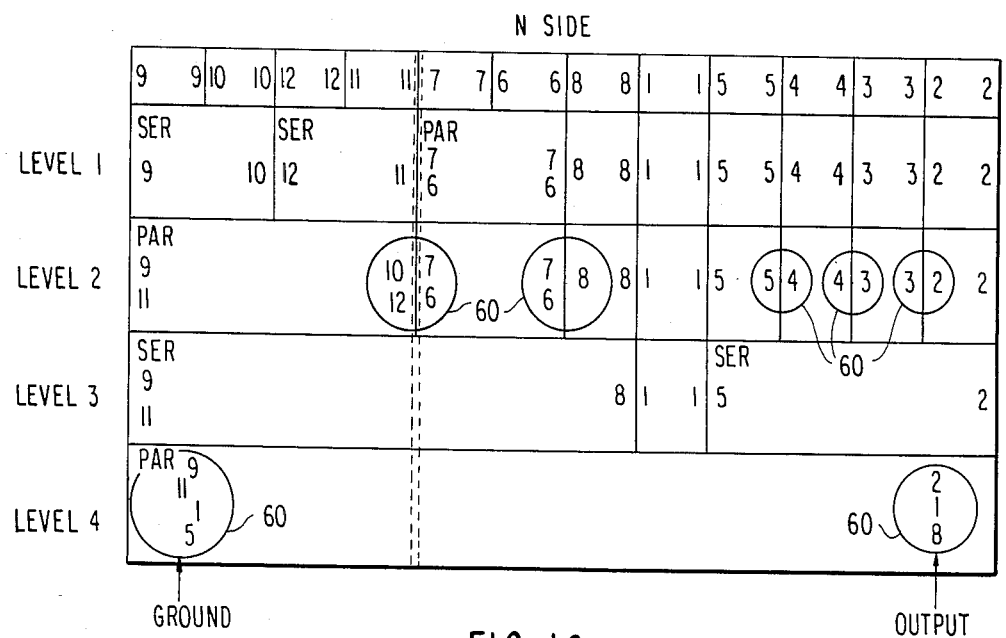
FIG. 10
FIG. 11
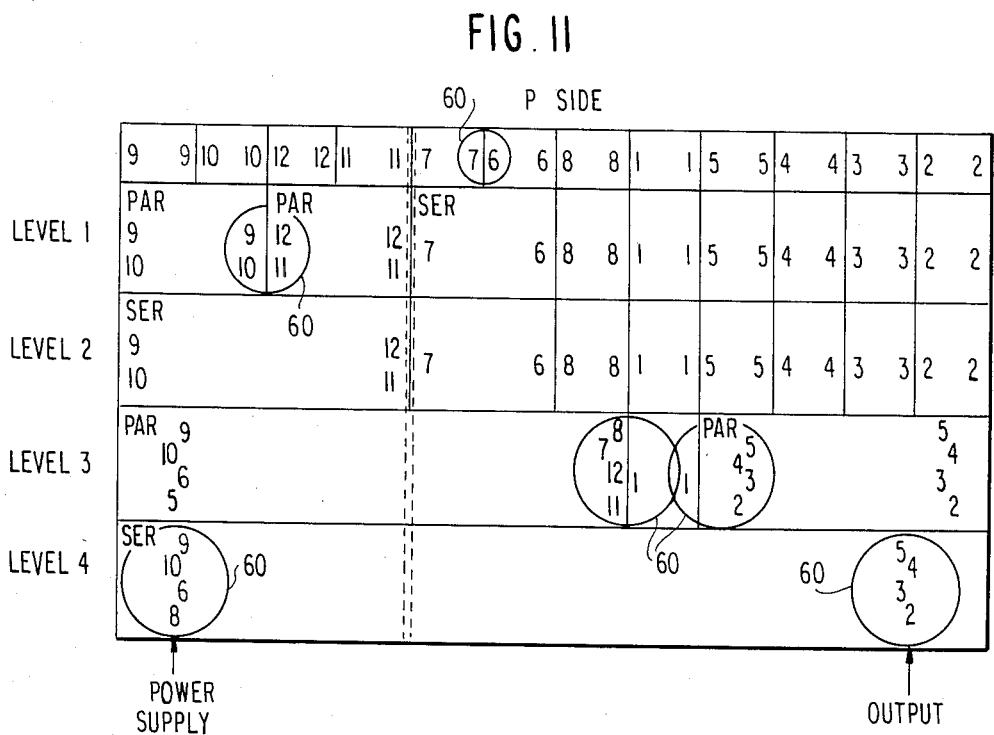

AUTOMATIC LAYOUT FOR CASCODE VOLTAGE SWITCH LOGIC

DESCRIPTION

1. Field of the Invention

The invention relates generally to integrated circuits. In particular, the invention relates to a method for automatically laying out a type of integrated circuit.

2. Background Art

A relatively new technology in integrated circuits is cascode voltage switch logic (CVS) or, as it is sometimes called, domino logic. This technology is described by Griffin et al. in U.S. patent application Ser. No. 554,156, filed Nov. 21, 1983 and by Erdelyi et al in a technical article entitled "Cascode Voltage Switch Logic" appearing in the IBM Technical Journal, vol. 27, no. 7A, December 1984 at 3791-3793. This is a CMOS technology. In its static version, for every p-channel FET (field-effect transistor) there is a corresponding n-channel FET. An example of a functional block of such a CVS circuit is shown in FIG. 1 for an exemplary logic function. An upper section, connected to a positive power supply +V, consists of five P-channel MOS transistors 1P, 2P, 3P, 4P and 5P with their respective gates connected to corresponding signals inputs 1G, 2G, 3G, 4G and 5G. A lower section of the circuit, connected to ground, consists of five N-channel MOS transistors 1N, 2N, 3N, 4N and 5N. The gates of the N-channel transistors are controlled by the same gate input signals 1G-5G as the corresponding P-channel transistors 1P-5P. At the junction between the P-channel and the N-channel section, there is an output node OUT that carries the output signal of the illustrated CVS functional block. The illustrated functional block would typically be a small part of a much larger logic circuit with other parts of the larger logic circuit having other different but similarly designed CVS functional blocks. The gate input signals 1G-5G are either primary inputs of the larger logic circuit or are the output signals OUT of other smaller CVS functional blocks.

One of the advantages of CVS logic is the compact design that is possible. For instance, the circuit of FIG. 1 can be laid out, as illustated in FIG. 2, using a P-type substrate. An N-type diffusion creates two upper N-wells 13 and 14 separated by a diffusion break 15 and two lower N-wells 16 and 18 also separated by the same diffusion break 15. Then a P-type diffusion creates two P-wells 20 and 22 within the upper N-wells 13 and 14. Finally, gate electrodes $22_1$, $22_2$, $22_3$, $22_4$ and $22_5$, are deposited over both the N-wells 16 and 18 and the P-wells 22 and are connected to the corresponding gate input signals 1G-5G. It is seen that a tightly packed and efficiently laid out circuit results, especially for a circuit that is considerably larger than that illustrated.

An inspection of FIG. 2 shows that the space occupied by the diffusion break 15 is the same space occupied by a gate electrode 22. Diffusion breaks 15 are required whenever equivalent paths cannot be formed through both the N-type transistors 1n-5N and the P-type transistors 1P-5P. An equivalent path is one that passes through the N-type transistors 1N-5N in the same order as the equivalent path passes through the P-type transistors under the condition that no path can cross itself. In FIG. 1, it is seen that the path through the P-type transistors 1P-5P needs to be divided. Whenever the path is broken, a diffusion break is made. Accordingly, a compact CVS design attempts to minimize the number of diffusion breaks as they double the gate-to-gate spacing. Uehara et al. in a technical article entitled "Optimal Layout of CMOS Functional Arrays" appearing in IEEE Transactions on Computers, vol. C-30, no. 5, May 1981 at pp. 305-312 describe a method for improving the density of similar CMOS circuits by ordering the CMOS gates. However Uehara et al require that the switch level representation of the circuit already be available. CVS logic is expected to be used in relatively large integrated circuits. The hand design of large integrated circuits, even assuming the availability of a logic diagram, is a time consuming job. As a result, there has been an increasing emphasis upon the automatic layout of integrated circuit chips utilizing computer programs. However, traditional automated design systems have sacrificed density and speed in order to reduce the total design and product introduction time. It is felt that presently available automated design is unsatisfactory, particularly for CVS.

SUMMARY OF THE INVENTION

It is therefore an object of this invention to provide for automated layout of integrated circuits.

It is a further object of this invention to provide for the layout of CVS circuits which minimizes the number of diffusion breaks.

The invention can be summarized as a method, amenable to automation, for laying out a circuit starting with a logic gate representation. The logic circuit is divided into functional blocks such that each block has a maximum number of transistors in series. Then, for each block, the transistors are ordered so as to minimize the number of transistors that do not have connections to neighboring transistors in a linear array. The internal wiring connections to the ordered transistors are then determined according to the type of logic gate they represent. Finally, the transistors and wiring are placed in their final layout.

BRIEF DESCRIPTION OF THE DRAWING

FIG. 5 is a gate level representation of an unpersonalized CVS functional block.

FIG. 6 is a integrated circuit level representation of the unpersonalized block of FIG. 5.

FIG. 7 is a table summarizing the rules for calculating level values.

FIG. 8 illustrates the calculation of the level values for the Boolean circuit of FIG. 4.

FIGS. 10 and 11 are tables illustrating the proces of determining the internal wiring.

DETAILED DESCRIPTION OF THE PREFERRED EMBODIMENT

Figure 3:
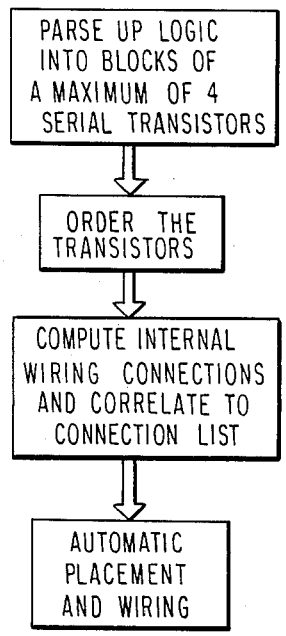
FIG. 3 is a flow diagram illustrating the steps required for automated design layout.

The invention presupposes the availability of a logic diagram for the desired cascode voltage switch (CVS) logic circuit. The practice of the invention uses four steps, shown in FIG. 3 for producing the CVS layout. First, the logic diagram is divided or parsed into blocks having a set maximum number of serially connected transistors. The maximum number is 4 in the example. Secondly, the ordering of the gates and breaks are computed according to a presented algorithm. Adjacent transistors, not separated by a diffusion break, are connected by the diffusion. Thirdly, the internal wiring connections are computed and are correlated to the connection list of the previous step. Finally, the individual gates can be automatically placed and wired. These steps will be presented in greater detail below. Each of the steps are described in sufficient detail as to allow the automatic layout by use of computer programs.

Figure 4:
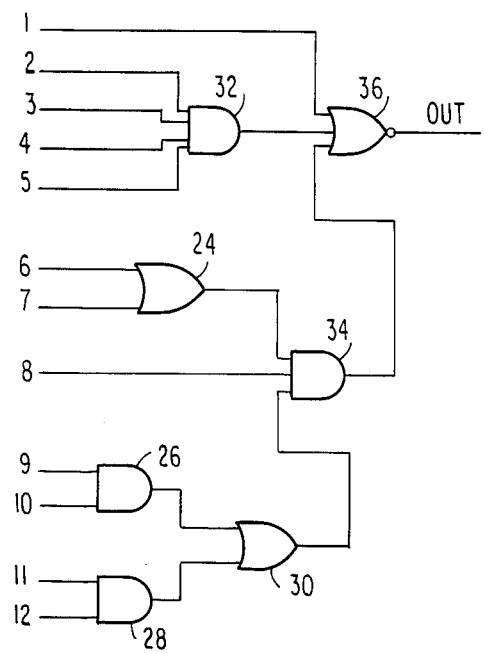
FIG. 4 is a Boolean representation of another exemplary CVS functional block.

To illustrate many of the algorithms of this invention, the same example will be used throughout. The exemplary Boolean logic circuit is shown in FIG. 4 and consists of four levels of logic driven by twelve inputs. The first level consists of an OR gate 24 and two AND gates 26 and 28. The second level consists of an OR gate 30. The third level consists of two AND gates 32 and 34. The fourth level consists of a NOR gate 36, the output of which is the output OUT of the basic logic group. The output OUT can be used either as an input to another logic group of a larger logic circuit or as the output of the logic circuit itself.

Single ended CVS derives its density advantage from a parallel arrangement of N-type FETs 38 and P-type MOS Transistors 40, as illustrated in FIG. 5. The corresponding N-type transistors 38 and the P-type transistors 40 share a common gate electrode and adjacent transistors 38 or 40 share a common source-drain region. The transistor representation of FIG. 5 is implemented in CVS by the integrated circuit representation of FIG. 6. The CVS integrated circuit consists of a lower N-diffusion mask 42 and upper N-well mask 44, through which N-type ions are diffused into a P-type substrate. A P-diffusion mask 46 is used to diffuse P-type ions into the resultant upper N-well 44. Over the resultant structure, an oxide is formed except in regions of paired contact holes 48 that provide contact to the underlying lower N-diffusions 42 or the P-diffusions 46. The two paired contact holes 48 are equivalent and provide external connection to the common source-drain. Transverse gate electrodes 50, of for instance polysilicon, control the gates of corresponding NMOS transistors 38 and PMOS transistors 40. The logic functionality is obtained by personalizing the metal and contact levels and various gate electrodes 50 are replaced by diffusion breaks in the diffusion masks 42-46. Transistors are preferably arranged so that the maximum number of connected transistors are adjacent to one another, thus minimizing the diffusion breaks.

One of the first steps for implementing a large logic chip by use of an automated design system is the parsing of the Boolean logic into smaller functional blocks. In the master slice and master image techniques, the designer is given a fixed set of functional blocks with which to construct his Boolean logic. Master slice uses NAND gates while master image provides a more expanded library of functional blocks. However, in either approach, the Boolean building blocks are set by the approach and the designer must use these blocks to design the Boolean logic necessary for the desired function. In the present approach, the designer is free to design his Boolean logic and the design system creates the required building blocks.

The process of parsing logic into small functional blocks, which then can be laid out using the single ended CVS approach, is driven by a number of guidelines. These guidelines are:

(1) Logic blocks in FET technology are normally inverting so that all functional blocks must have an inverted output.

(2) In CMOS technology, the speed of the device is limited by the number of devices in a series which drive a capacitive load. This speed constraint is particularly true for P-type devices which have a greater resistance than n-type devices.

(3) A functional cell may not have any internal fan-out on a logic gate output.

(4) A functional cell may not have any internal feedback. Latches and other types of feedback devices must be made by externally cross-coupling a pair of functional cells such as inverters, NAND gates or NOR gates.

(5) Each functional block has only one output. However, the number of inputs to a functional block is not so limited.

These restraints imply a number of rules for breaking up a larger circuit into smaller functional blocks. These rules are as follows:

(1) Every output of the chip must be the output of a functional block. All these outputs must be buffered to provide enough drive capability off-chip.

(2) Every internal node which has a fan-out equal to or greater than 2 must be made an output of a functional block.

(3) Every internal node of the circuit which is driven by a negated logic gate may be an output of a functional block.

(4) Once all the outputs of the functional blocks have been determined, the logic gates are assigned to a functional block so as to maximize the number of P and N transistors in series up to a maximum number corresponding to a maximum delay consistent with the desired speed of the device. An algorithm will be presented for determining the number of P and N transistors in series.

(5) For any logic gates remaining, their outputs are inverted and the process continues of maximizing the number of P and N devices in series up to the maximum limit. The inversion must be done in light of the fact that all functional block outputs will have to be inverted.

Gates are added to the functional blocks until the maximum number of series transistors has been reached. By applying logic synthesis techniques in the process, inverters can be pushed either backwards of forwards through a circuit to ensure that every functional block will have four transistors in series. The process of determining the number of series devices is described in detail below. Of course, the requirement of four series devices is an arbitrarily set limit. Other values could be used dependent upon the technology. The described approach does not ensure an optimal restructuring in terms of speed and density. Such optimization is probably possible only by trial and error. The described approach simply guarantees the automatic but nonetheless satisfactory selection of functional blocks.

Figure 1:
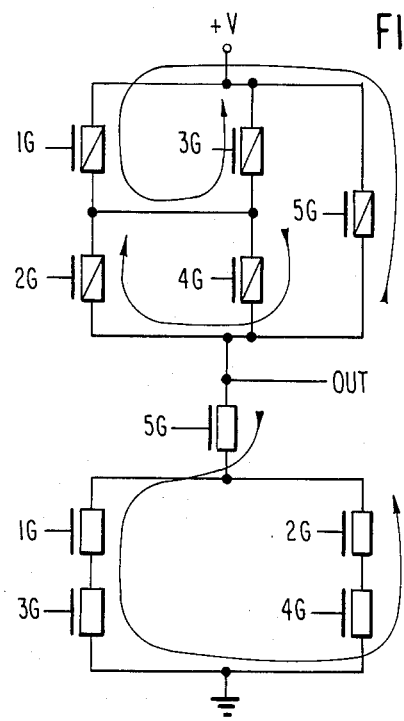
FIG. 1 is a schematic diagram of an exemplary functional block in a CVS circuit.
Figure 2:
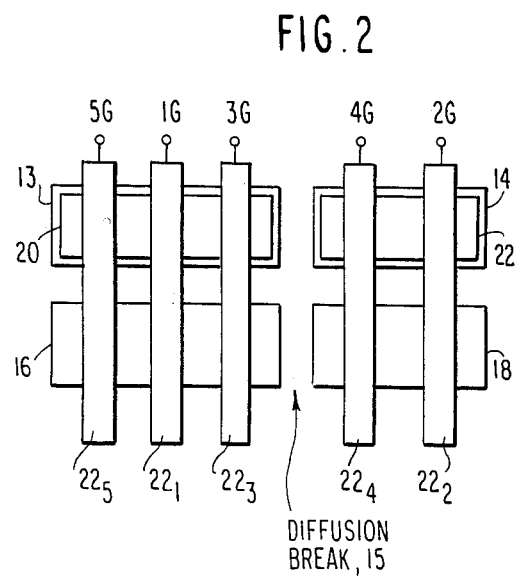
FIG. 2 is an illustration of layout of the CVS functional block of FIG. 1.

The determination of the number of transistors in series between the power supply and the output OUT, as illustrated in FIG. 1, is important for speed considerations. In CMOS CVS logic, the concept of duality can be applied. Since for every P-type transistor there is a corresponding N-type transistor, and the gates of both transistors are controlled by a common signal, the P-type transistor is off when the corresponding N-type transistor is on and vice versa. Furthermore, a configuration of P-type devices in series will imply a configuration of corresponding N-type devices in parallel and vice versa. As in NMOS technology, a group of N-type devices in series provide an AND function and a group of N-type devices in parallel provide an OR function. Similarly, the duality implies that P-type devices in series provide an OR function and P-type devices in parallel provide an AND function. As a result, Boolean AND gates increase the number of N-type devices in series, ultimately increasing the number of levels, between the output OUT and ground. On the other hand, Boolean OR gates increase the number of P-type devices in series between the power supply and the output OUT. The speed of the CVS circuit is inversely proportional to the number of levels in the logic block. A rule is set that the number of P-type transistors in series and the number of N-type transistors in series is limited to four. This limitation is, of course, arbitrary. Another possiblity would have been to set the limit at three P-type devices in series and five N-type devices in series to account for the differing speeds of the two device types.

The algorithm used to determine the number of levels in any logic block is as follows:

(1) Assign to each input to the logic group an N-type level value of one and a P-type level value of one.

(2) The number of serial P-type transistors is determined by the P-type level value at the output OUT as follows:

(a) Assign to the output of an AND gate a P-type level value that is the maximum value of the P-type level values attributed to the inputs of that AND gate.

(b) Assign to the output of an OR gate a P-type level value which is the summation of the P-type level values attributed to the inputs of that OR gate.

(c) Continue through the combinatorial logic until the output OUT is reached. The final value of the P-type level value at this output OUT is the number of P-type devices in series between the power supply and the output OUT.

(3) Similarly, the number of N-type transistors in series is determined by an N-type level value at the output OUT as follows:

(a) Assign to the output of an AND gate an N-type level value which is the summation of the N-type level values of all of the inputs of the AND gate.

(b) Assign to the output of an OR gate a N-type level value which is the maximum value of the N-type level values attributed to the inputs of that OR gate.

(c) Continue through the combinatorial logic until the output OUT is reached. The final value of the N-type level value at this output OUT is the number of N-type devices in series between ground and the output OUT.

This procedure for determining the number of series devices is summarized in FIG. 7. The algorithm is applied to the logic block of FIG. 4, as illustrated in FIG. 8. In this figure, the first number in parentheses is the P-type level value and the second number is the N-type level value.

The example of FIG. 8 provides no more than the maximum number of four serial devices so that the logic block of FIG. 8 does not need to be broken up. If however the level values at an output exceeded the respective limits for P-type or N-type level values, then the next lower logic gates which do not have their level values exceeding the limits define the right-most limit of the allowed logic block. All logic gates supplying inputs directly or indirectly to the logic gate at the right most limit are included in the allowed logic block.

If more than one logic block is found to be required, then the output of the first defined logic block is used as a primary input on another logic block with a P-type level value and N-type level value of unity assigned to that input.

The rules limit the output logic gate of a logic block to be inverting, that is either a NAND or NOR gate with all other logic gates being either AND or OR gates. In fact, this set of limitations imposes no real limitations. Brayton et al. in two technical articles entitled "Fast Recursive Boolean Function Manipulation" and "The Decomposition and Factorization of Boolean Expressions" appearing in IEEE International Symposium on Circuits and Systems 1982, have shown transformations of logic circuits that allow the inverting NOT function to be pushed forwards or backwards through the logic circuit with an accompanying transformation of the type of the logic gate. Thus the gate ordering can proceed irrespective of the existence of the NOT function. Once the logic blocks have established, the transformation is performed to ensure the placement of a NAND or NOR gate at the output of a logic block and nowhere else. If an additional inverting function between logic blocks is required, then a trivial logic block is inserted of a NOT gate, a single CMOS pair of transistors.

The second step in the invention is the process of ordering the gate electrodes which is equivalent to finding equivalent paths through the N-type and P-type transistors. Pseudo inputs P are inserted to guarantee that traversing a group of gate select rods does not result in returning to the start. A pseudo input P or more than one neighboring pseudo-inputs correspond to a diffusion break. For maximum density circuits, the number of diffusion breaks is minimized, that is, the paths are made as long as possible.

An algorithm for ordering the gate electrodes in order to minimize the diffusion breaks was presented in the previously cited article by Uehara et al although they relied upon the existence of a switch-level representation of the circuit. The algorithm presented here is a slightly modified version that enables the ordering to be performed at the Boolean gate level. Each logic gate $G_i$ is assigned a list of inputs $G_i(A:B:C)$ where the list is divided into sub-lists A, B and C. The lists are in turn composed of sub-lists, for example, A=(a,b,c) where the sub-lists a, b and c consist of the inputs of lower level Boolean gates that directly or indirectly control the inputs of the Boolean gate being considered. The ordering relies upon the fact that the sub-lists can be arranged in any order since unconnected inputs to an AND or OR gate are equivalent. For example, the three inputs of a three-input AND gate are equivalent. Furthermore, the order within the sub-lists can be reversed for the same reason.

For every Boolean gate that has an even number of inputs, a pseudo-input P is added to the beginning of the input lists. The lists for the logic block of FIG. 4 is presented in Table 1.

TABLE 1

| Level 1 | $G_{24}$ (P:7:6) |
| --- | --- |
|  | $G_{26}$ (P:9:10) |
|  | $G_{28}$ (P:11:12) |
| Level 2 | $G_{30}$ (P:$G_{26}$:$G_{28}$) |
| Level 3 | $G_{32}$ (P:2:3:4:5) |
|  | $G_{34}$ ($G_{24}$:8:$G_{30}$) |
| Level 4 | $G_{36}$ (1:$G_{32}$:$G_{34}$) |

Figure 9:
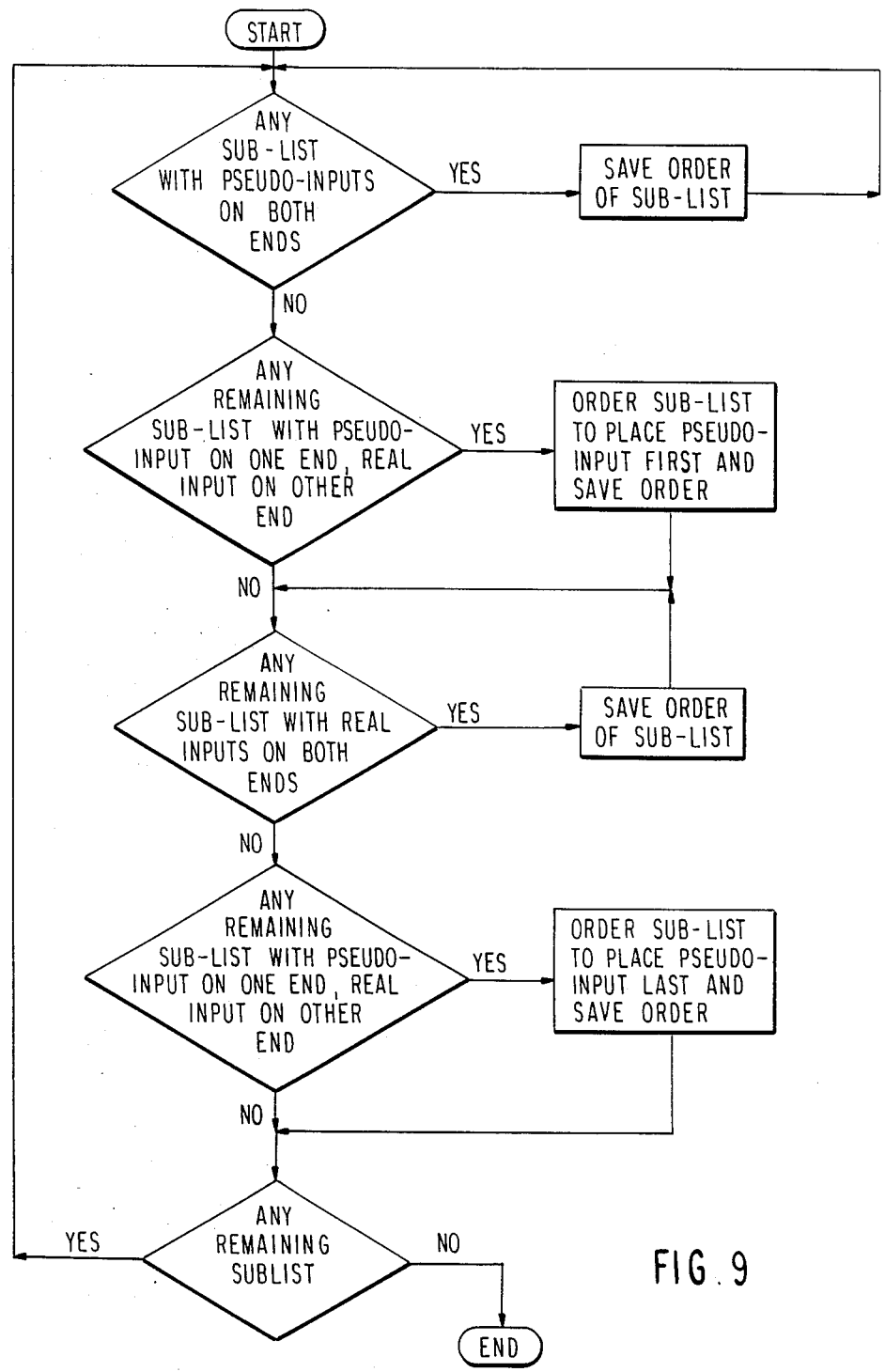
FIG. 9 illustrates the process of ordering inputs or gate electrodes.

The ordering algorithm is shown in the flow diagram of FIG. 9 and is sequentially applied to each of the Boolean gates of a logic group beginning with the gates in the lowest level. The ordering in the lower levels is substituted into the sub-lists of the higher level gates. In the first step, it is determined if there is any input sub-list that has pseudo-inputs P at both ends. A sub-list with a single entry is defined to have that same entry at both ends. If there is such a sub-list, that one sub-list is saved in the presented order and execution returns to the first step.

If there is no sub-list with pseudo-inputs on both ends, then execution moves to a second step where it is determined if there is a remaining input sub-list with a pseudo-input P at one end and a real input at the other. If such a sub-list exists, then this sub-list is saved with the pseudo-input P placed first by a rotation of the entries in the sub-lists if necessary. Only one sub-list is saved at a time per each execution of the second step.

Regardless of the outcome of the test of the second step, execution continues in the third step in which it is determined if there is a remaining input sub-list that has real inputs on both ends. If there is such a sub-list, then that one sub-list is saved on the stated order and then execution returns to the third step to find the remaining sub-lists with real inputs on both ends.

When all the sub-lists with real inputs on both ends have been saved, the test of the third step produces a negative result and execution is transferred to a fourth step in which it is determined if there is a remaining input sub-list with a pseudo-input P on one end and a real input on the other end. Note that this is the same test as in the second step. If such a sub-list is found, that one sub-list is saved with the pseudo-input P placed last with a rotation of the sub-list if necessary.

Then it is determined if there are any input sub-lists remaining to be processed for the one Boolean gate. If there are, then execution returns to the first step and in this way all input sub-lists are eventually saved. Once the input sub-lists are all saved, the algorithm is completed for the one Boolean gate. The algorithm is then successively applied to the remaining Boolean gates of that level and then to the gates of the next higher level until the output OUT is reached.

The effect of the algorithm is to place pseudo-inputs P at either end of the final saved list or to cluster them at internal points. One or more adjacent pseudo-inputs P represent a single diffusion break. Diffusion breaks are required at either end in any case. Clustering of pseudo-inputs P reduces the final number of diffusion breaks.

TABLE 2

Level 1
$G_{24}$(P:7:6) → $G_{24}$(P,7,6)

TABLE 2-continued $G_{26}$(P:9:10) → $G_{26}$(P,9,10)
$G_{28}$(P:11:12) → $G_{28}$(P,11,12)
Level 2
$G_{30}$(P:26:$G_{28}$) = $G_{30}$(P:P,9,10:P,11,12)
→$G_{30}$(P,P,9,10,12,11,P)
Level 3
$G_{32}$(P:2:3:4:5) → $G_{32}$(P,2,3,4,5)
$G_{34}$($G_{24}$:8:$G_{30}$)
=$G_{34}$(P,7,6:8:P,P,9,10,12,11,P)
→$G_{34}$(P,P,9,10,12,11,P,P,7,6,8)
Level 4
$G_{36}$(1:$G_{32}$:$G_{34}$) =
$G_{36}$(1:P,P,9,10,12,11,P,P,7,6,8:P,2,3,4,5)
→$G_{36}$(P,P,9,10,12,11,P,P,7,6,8,1,5,4,3,2,P)

The algorithm of FIG. 9 is applied to the input lists of Table 1 to produce the saved lists of Table 2. A saved list has its entries separated by commas instead of colons. The application of the algorithm to level one is trivial since it results in the sub-lists being saved in the same order in which they were presented. A rotation of the single entry sub-list causes no change. The operation for level two is a bit more complex. First of all, saved lists of level one are substituted into the presented lists of level two. The first sub-list P satisfies the first test and is immediately saved. The second sub-list (P,9,10) satisfies the second test and is saved in the presented order since the pseudo-input is first. There is no sub-list that satisfies the third test. However, the third sub-list (P,11,12) satisfies the fourth test and is saved in reverse order in order to place the pseudo-input P last. A single pass through the algorithm processes all the sub-lists for the one Boolean gate in the second level.

The processing of the gate list $G_{34}$ in the third level introduces the effect that the third sub-list (P,P,9,10,12,11,P) is saved before the second sub-list (8). The saved list $G_{36}$ for the output Boolean gate 36 shows only one internal diffusion break for all ten inputs. If this is not the optimal result, it is very close. The final gate ordering is the sequence of gate electrodes of the form (9 10 12 11-7 6 8 1 5 4 3 2), where "-" represents a diffusion break.

This gate electrode ordering further provides a list of connections. A connection is a source-drain area shared by two neighboring gate electrodes or is the source or drain area facing a diffusion break. These are the areas that can be connected to through the contact holes 48. It should be noted that because of the bi-directionality of MOS gates, it is not necessary to distinguish between the source and drain. The list of available wiring connections for the example of Table 2 is: (9, 9-10, 10-12, 12-11, 11, 7, 7-6, 6-8, 8-1, 1-5, 5-4, 4-3, 3-2, 2), where a single number is a source drain area facing a diffusion break and two numbers separated by "-" is a shared source/drain area between the respectively numbered electrodes.

The previously described gate ordering algorithm has arrived at the desired order of the gate electrodes, or alternatively of the P-type and N-type transistors controlled by that gate electrode. It should be noted that aside from the parsing prior to the ordering operation, no consideration has been given as to whether the logic gates are AND gates or OR gates. Thus the ordering procedure differs significantly from that of Uehara et al. whose odering is based on a completely defined transistor level circuit.

The internal wiring algorithm will now be described. The algorithm accours for which of the logic gates are AND gates and which are OR gates. In a simple logic group consisting of a single AND gate, the two N-type transistors are wired in series and the two P-type transistors are wired in parallel. However, in a more complex functional cell, a higher level logic function may include several AND or OR gates which are interconnected. The same series/parallel rules arising from the CMOS duality apply in this case but it is much more difficult to know which transistors should be connected together to form the proper series/parallel combination while still maintaining a high density layout. Accordingly, a rather complex internal algorithm is required to account for all possible combinations.

Since a number of transistors already share the same source/drain diffusions, as determined by the gate ordering algorithm, a portion of the connections have already been implicitly defined. The remaining connections must take into account which side of the transistors receives the connections and to where the power supply, the ground and the output OUT are connected. The method used to determine these connections is tabular and is defined as follows:

(1) Form two tables, one for the N-side and one for the P-side, as shown in FIGS. 10 and 11. In each of the tables the top row contains a cell for each gate electrode input and the inputs are listed twice, on the left and right sides in each cell in the order determined by the ordering algorithm.

(2) Include a level row in the tables for each level of logic, four levels in the example of FIG. 4.

(3) Partition each level row into cells such that each cell represents a logic gate in the respective level of logic and contains all the gate electrode inputs that affect the represented logic gate. In the example of FIG. 4, there are three cells in level one corresponding to the three logic gates 24, 26 and 28, one cell in level two corresponding to logic gate 30, two cells in level three corresponding to logic gates 32 and 34 and one cell in level four corresponding to the output logic gate 36.

(4) If there is a break in the diffusion as determined by the ordering algorithm, place dotted lines vertically downward through both tables between the two gate electrode inputs where the diffusion break occurs. In the example, the ordering algorithm determines that the diffusion break occurs between gate electrode 7 and gate electrode 11. The dotted lines in FIGS. 10 and 11 indicate that there is no diffusion connection between the gate electrode inputs on either side of the dotted lines.

(5) For the N-side table place a PAR (for parallel) in the upper left hand corner of each cell which represents an OR gate (or a NOR gate on the output) and an SER (for serial) for each cell which represents an AND gate (or a NAND output gate).

(6) For the P-side table of FIG. 11, place a PAR in the cells which represent AND (NAND) gates and a SER in the cells which represent OR (NOR) gates. This rule is the reverse of the rule for the labelling of the N-side table. These two labellings are the only places where the type of logic gate is introduced.

(7) Working from the top of the tables to the bottom:

(a) extend cell boundaries into regions of the lower levels which have not been divided into cells until a divided region, already labelled by PAR or SER, is reached. Such an extension represents an electrical signal passing through a level without inputting a logic gate;

(b) for cells which do not have a SER or PAR in their upper left corner, copy the contents of the cell above into that cell;

(c) for each cell which contains a SER label (for series) in its upper left corner: (i) on the left boundary, copy the set of numbers which are contained on the left boundary of the left-most cell immediately above; (ii) on the right boundary, copy the set of numbers which are contained on the right boundary on the right-most cell immediately above; and (iii) for each internal boundary on the cells above the current cell, encircle the two sets of numbers on each side of the boundary. The circles represent connections 60. For instance, in the P-side graph of FIG. 11, (7,6) is circled in the top row;

(d) for each cell which contains a PAR level (for parallel) in its upper left corner: (i) on the left boundary create a set of numbers which is composed of one set of the two sets of numbers at the two sides of each cell above. The sets may be taken from either the left boundary or from the right boundary in any of the cells. However, the sets which are adjacent on a boundary, that is not broken by a dotted line, must be kept together in the final set. These two constraints may be satisfied by alternately choosing the left boundary set and the right boundary set moving across the row. The freedom of selection in this step implies that there are a number of equivalent ways to wire the circuit; and (ii) on the right boundary, create a set of numbers which is composed of the one set of numbers from each cell above which have not already been used to form the left boundary set. In simple terms, collect all the numbers remaining after forming the left boundary set.

(8) Circle both sets of numbers as connections 60 which apppear in the bottom level row of the two wiring tables. On the n-side table of FIG. 10, these bottom connections are for the output OUT and ground and on the n-side table of FIG. 10. The bottom connections on the P-side table of FIG. 11 are for the output OUT and the power supply. The selection is arbitrary and reflects the fact that the P-side and the n-side circuits merely provide conducting paths between the output OUT and the power supply and ground respectively.

(9) Each set of numbers that are enclosed by a circle denotes a common connection to one of the two sides of the gate electrodes designated by those numbers. Which side is immaterial as long as the wiring connection is available. These connections are therefore correlated against the previously generated list of available wiring connections to determine where the wires should be placed.

As previously mentioned for the example, the list of available wiring connections, as shown in the top row of both the P-side and the n-side tables, is: (9, 9-10, 10-12, 12-11, 11, 7, 7-6, 6-8, 8-1, 1-5, 5-4, 4-3, 3-2, 2).

Drawing from this list, the connections to the diffusion on the P-side are:

(7, 6)→(7-6),
(9, 10, 11, 12)→(9, 10-12, 11),
(8, 7, 12, 11, 1)→(12-11, 7, 8-1),
(1, 5, 4, 3, 2)→(1-5, 4-3, 2),
(9, 10, 6, 8)→(9-10, 6-8)→Power supply, and
(5, 4, 3, 2)→(5-4, 3-2)→Output OUT.

Thus it is seen that a connection is made to all the P-type transistors which are to be interconnected and the connection can be made to either the shared source-drain region or to a source or a drain facing a diffusion break. A similar set of connections is made on the n-side as follows:

(9, 10)→(9-10),
(12, 11)→(11-12),
(10, 12, 7, 6)→(10-12, 7-6),
(7,6,8)→(7, 6-8),
(5, 4)→(5-4),
(4, 3)→(4-3),
(3, 2)→(3-2),
(9, 11, 1, 5)→(9, 11, 1-5)→Ground, and
(2, 1, 8)→(8-1, 2)→Output OUT.

Figure 12:
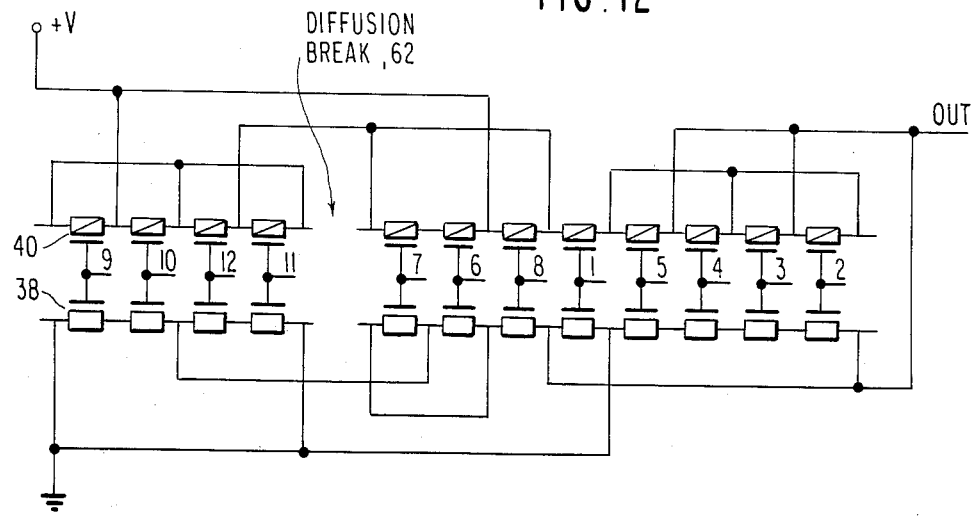
FIG. 12 is a transistor level representation of the gate-ordered circuit of FIG. 4.

A schematic representation of the single ended CVS circuit produced by the internal wiring algorithm is shown in FIG. 12. This is a switch-level representation although the N-type transistor 38 and the P-type transistor 40 are shown in the same sequence as in the final layout and the distinction between diffusion connections and wiring connections are apparent. A diffusion break 62 interrupts the otherwise present diffusion connections.

With the circuit diagram of FIG. 12, represented in the appropriate computerized data bases, the semiconductor layout can be finally accomplished by automatic placement and wiring algorithm. These techniques have been used in the past with automatic design systems such as master slice and master image and present no inherent problems in single ended CVS. One such technique is disclosed by K. Lallier in U.S. patent application Ser. No. 495,021, filed May 16, 1983. The important aspect of the final image defined by means of the present invention is that all gates electrodes are placed at constant pitch and may be extended to contact the first layer metal in the wiring channel. The placement and wiring algorithms must be able to accommodate the fine granularity of one transistor length associated with the cell size.

Figure 13:
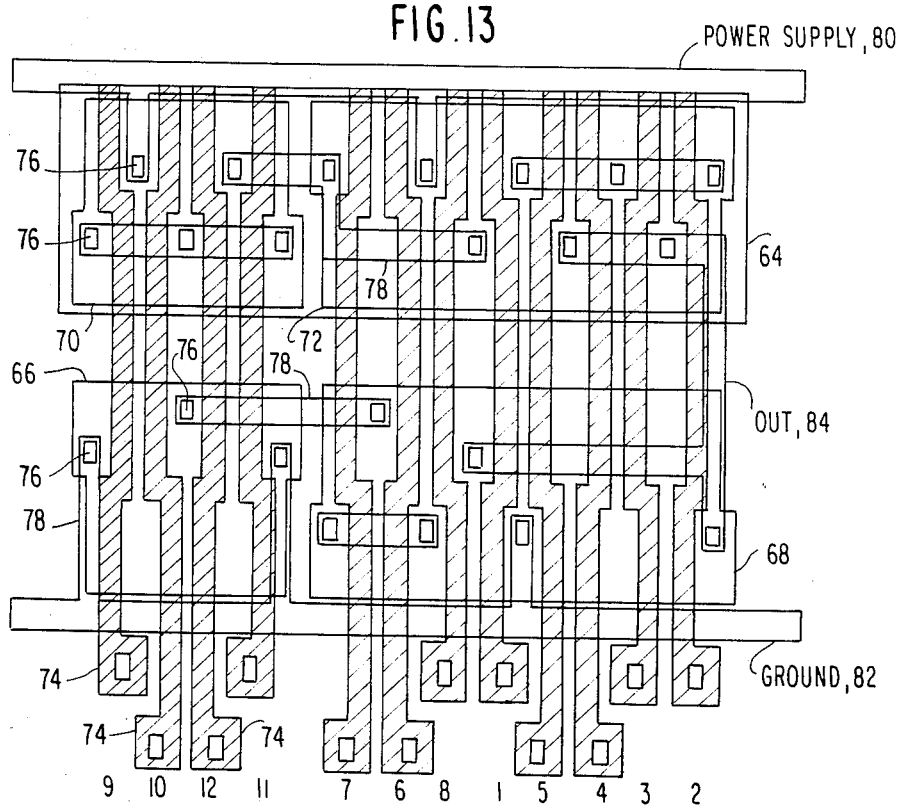
FIG. 13 is a plan view of the final circuit layout for the circuit of FIG. 4.

An example of the final layout for the circuit of FIG. 12 is shown in FIG. 13. An upper N-well 64 is unbroken. However, a diffusion break splits the lower N-diffusion masks 66 and 68 and also splits the P-diffusion mask into two P-diffusion masks 70 and 72. Gate electrodes 74 are laid at fixed pitch except for the diffusion break. Contact holes 76 reach down to connect the diffusions to metal connections lines 78. The connections lines 78 may be connected to a power supply line 80 or a ground line 82. The output OUT is likewise a selected connection line 84. The gate electrodes 74 are twisted to avoid the contact holes 76 and thus provide greater density.

The circuit automatically laid out according to this invention provides a circuit with high density and a low switching time relative to a circuit in which each logic gate forms its own CVS logic group. Although similar density and speed could probably be obtained by a careful trial and error design, the invention provides a method for arriving at a nearly optimal design in a single pass and to perform the design automatically.

Although the example has been described in terms of flow diagrams and table construction, it is apparent that a suitable computer program to perform the same tasks can be written. The computer program of course offers the advantages of additional speed and error-free design.

What is claimed is:

1. A method of synthesizing a circuit comprising paired N-type and P-type field effect transistors from a logic gate representation, comprising the steps of:
   dividing said logic gate representation into one or more functional blocks, each said block having no more than a first predetermined number of serially connected P-type transistors and no more than a second predetermined number of serially connected N-type transistors;
   ordering the pairs of transistors for maximizing the number of pairs of contiguously connected transistors, said P-type transistors being arranged in a first linear array and said N-type transistors being arranged in a second linear array;
   then establishing the internal wiring connections exclusive of said contiguous connections between said transistors in said first array and between transistors in said second array from the types of logic gates represented by said transistors; and
   creating a circuit layout of said first linear array of said ordered P-type transistors parallel to said second linear array of said ordered N-type transistors including said contiguous connections; and
   interconnecting said N-type transistors and interconnecting said P-type transistors according to said internal wiring connections.

2. A method for synthesizing a circuit layout as recited in claim 1, wherein said step of creating a circuit layout including the contiguous connections comprises one or more diffusion steps for creating at least two parallel diffusion wells and laying one or more common conductive electrodes across said two diffusion wells, each said common electrode acting as a common gate electrode for one said pair of transistors.

3. A method for synthesizing a circuit layout as recited in claim 2, wherein said interconnecting step comprises electrically connecting different points of one or more diffusion wells of the same conductivity type and connecting a first point of a diffusion well of one conductivity type to a second point of a diffusion well of another conductivity type for forming an output of said two linear arrays.

4. A method for synthesizing a circuit layout as recited in claim 1, further comprising the steps of:
   assigning to each input of every logic gate that does not receive an output of a logic gate within the same functional block a P-type level of one and an N-type level of one;
   assigning to each output of an AND or NAND logic gate a P-type level which is the maximum of the P-type levels of all the inputs to said AND or NAND logic gate;
   assigning to each output of an AND or NAND logic gate an N-type level which is the sum of the N-type levels of all the inputs of said AND or NAND logic gate;
   assigning to each output of an OR or NOR logic gate a P-type level which is the sum of the P-type levels of all the inputs of said OR or NOR logic gate;
   assigning to each output of an OR or NOR logic gate an N-type level which is the maximum of the N-type levels of all the inputs of said OR or NOR logic gate;
   assigning said N-type and P-type levels assigned to said outputs to an N-type level and a P-type respectively of an input of a logic gate according to connections of said logic gate representation;
   wherein said N-type level assigned to an output is associated with a number of serially connected N-type transistors and said P-type level assigned to an ioutput is associated with a number of serially connected P-type transistors.

* * * * *